(12) United States Patent
Ishizuka et al.

(10) Patent No.: US 6,586,261 B1
(45) Date of Patent: Jul. 1, 2003

(54) METHOD FOR DETERMINING A PRECEDING WAFER GROUP

(75) Inventors: Hiroaki Ishizuka, Kyoto (JP); Shigeru Matsumoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 156 days.

(21) Appl. No.: 09/649,573

(22) Filed: Aug. 29, 2000

(30) Foreign Application Priority Data

May 30, 2000 (JP) ........................................ 2000-160709

(51) Int. Cl.$^7$ .............................................. H01L 21/00
(52) U.S. Cl. .......................................................... 438/5
(58) Field of Search ........................... 438/14, 5, 7, 10, 438/6, 8, 9, 11, 12, 13, 15, 16, 17, 18

(56) References Cited

U.S. PATENT DOCUMENTS 5,926,690 A * 7/1999 Toprac et al. ................. 438/17
5,989,762 A * 11/1999 Takaoka ...................... 356/399

FOREIGN PATENT DOCUMENTS

JP 7-99145 4/1995

* cited by examiner

*Primary Examiner*—Evan Pert
(74) *Attorney, Agent, or Firm*—Nixon Peabody LLP; Donald R. Studebaker

(57) ABSTRACT

In the method for determining a preceding wafer, at least one semiconductor wafer is determined as a preceding wafer among a plurality of semiconductor wafers constituting one lot. The preceding wafer is then subjected to a given process among a plurality of processes for fabrication of a semiconductor device. The determination of the preceding wafer is based on processing results of an upstream process among the plurality of processes performed for the plurality of semiconductor wafers prior to the given process. After examination of processing results of the given process on the preceding wafer, the given process is performed for the plurality of semiconductor wafers other than the preceding wafer.

2 Claims, 11 Drawing Sheets

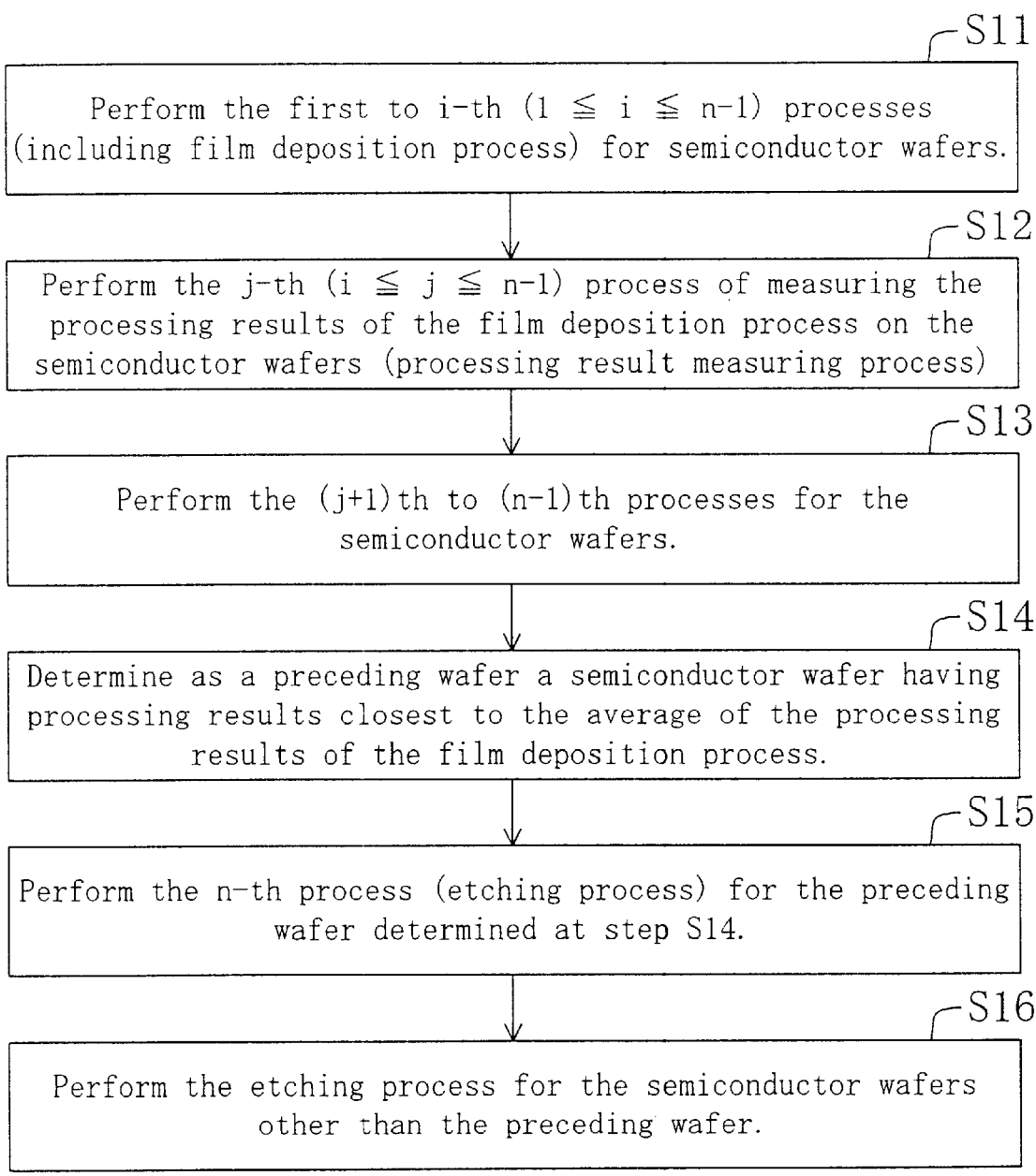

METHOD FOR DETERMINING A PRECEDING WAFER GROUP

BACKGROUND OF THE INVENTION

The present invention relates to a method for determining a preceding wafer to be used for preceding processing among a plurality of semiconductor wafers constituting one lot, a method for determining a measuring wafer to be used for measurement of processing results among a plurality of wafers constituting one lot, and a method for adjusting the number of semiconductor wafers constituting one lot.

In fabrication of semiconductor devices, semiconductor wafers that are grouped into lots are subjected to a plurality of processes for every lot. In general, the performance of a fabrication apparatus used in a process varies with lots. The processing results therefore vary with lots even when all lots are subjected to the same process under the same processing conditions.

In order to suppress a variation in processing results among lots, preceding processing is adopted. That is, among a plurality of semiconductor wafers constituting one lot (hereinafter, referred to as inner-lot wafers), one to several semiconductor wafer(s) are selected as a preceding wafer or wafers. A given process is preliminarily performed for the preceding wafer(s). Based on the results of the given process on the preceding wafer(s), the conditions of the given process are adjusted, so that the other semiconductor wafers in the same lot are subjected to the given process under the adjusted conditions.

In fabrication of semiconductor devices, also, a measuring process is inserted during the fabrication to examine whether or not the results of a process already performed for a lot have reached the target value for the process. This measuring process is generally performed for one to several measuring wafer(s) selected among the inner-lot semiconductor wafers for improvement of the throughput.

Conventionally, as the preceding wafer or the measuring wafer, selected is a semiconductor wafer located outermost in a wafer box among inner-lot wafers, or a semiconductor wafer having the least wafer number (wafer number is given uniquely to each semiconductor wafer) or a heading wafer identification (ID) (ID is given uniquely to each semiconductor wafer).

That is, in the conventional methods, the preceding wafer or the measuring wafer is determined without consideration of a variation in processing results among inner-lot wafers. This causes problems as described below.

(Problem of Conventional Method for Determining Preceding Wafer)

A semiconductor wafer determined as a preceding wafer may be a wafer having processing results largely deviated from the average of the processing results of a process performed for wafers in the same lot prior to a given process for which preceding processing is intended. In such a case, if the conditions of the given process are adjusted based on the processing results of the given process on the preceding wafer and the given process is performed for the inner-lot wafers other than the preceding wafer under the adjusted conditions, the processing results of the given process may fail to be within specifications for a majority of the inner-lot wafers.

The above problem of the conventional preceding wafer determination method will be described with reference to FIGS. 9(a) and 9(b), taking the case of performing preceding processing for an etching process as an example. The etching in this case is made for a film deposited on each of five semiconductor wafers constituting one lot. In FIGS. 9(a) and 9(b), the respective semiconductor wafers as substrates are omitted for simplification.

FIG. 9(a) illustrates the results of the process of depositing films on semiconductor wafers Nos. 1 to 5 (film deposition process). As shown in FIG. 9(a), among the thicknesses of the deposited films (deposited film thicknesses) of semiconductor wafers Nos. 1 to 5, denoted by d1, d2, d3, d4, and d5, respectively, the deposited film thickness d1 of semiconductor wafer No. 1 is smallest.

FIG. 9(b) illustrates the results of the etching process performed for semiconductor wafers Nos. 1 to 5 after the film deposition process based on preceding processing performed for semiconductor wafer No. 1 as a preceding wafer. More specifically, semiconductor wafer No. 1 is preliminarily etched so that the film thickness remaining after the etching (post-etching film thickness) is equal to a predetermined target value (target film thickness), to determine the etching time required for the etching process. Thereafter, remaining semiconductor wafers Nos. 2 to 5 are etched for the determined etching time. At this time, it is presumed that the etching amounts, that is, the etching depths of the films on semiconductor wafers Nos. 1 to 5 are roughly the same.

As shown in FIG. 9(b), the post-etching film thicknesses of semiconductor wafers Nos. 2 to 5 are larger than the target film thickness by e2, e3, e4, and e5, respectively. In particular, the post-etching film thicknesses of semiconductor wafers Nos. 2, 4, and 5 exceed the upper limit. In FIG. 9(b), the respective areas defined by the dotted lines represent the portions of the films deposited at the film deposition process shown in FIG. 9(a) but removed at the etching process.

(First Problem of Conventional Method for Determining Measuring Wafer)

In measurement of the processing results of a given process on inner-lot wafers using a measuring wafer, the semiconductor wafer determined as the measuring wafer may be a wafer having the processing results largely deviated from the average of the processing results of a process performed for wafers in the same lot prior to the given process. In such a case, the average processing results of the given process on the inner-lot wafers will not be obtained by measuring the processing results of the given process on the measuring wafer.

The above first problem of the conventional measuring wafer determining method will be described with reference to FIGS. 10(a) and 10(b), taking as an example the case of measuring the film thickness remaining after etching (post-etching film thickness) of a film; deposited on each of five semiconductor wafers Nos. 1 to 5 constituting one lot. In FIGS. 10(a) and 10(b), the respective semiconductor wafers as substrates are omitted for simplification.

FIG. 10(a) illustrates the results of the process of depositing films on semiconductor wafers Nos. 1 to 5 (film deposition process). As shown in FIG. 10(a), among the deposited film thicknesses of semiconductor wafers Nos. 1 to 5, denoted by s1, s2, s3, s4, and s5, respectively, the deposited film thickness s1 of semiconductor wafer No. 1 is most largely deviated from a predetermined target value (target deposited film thickness).

FIG. 10(b) illustrates the results of the etching process performed for semiconductor wafers Nos. 1 to 5 after the film deposition process. Assume that the etching process has been performed for semiconductor wafers Nos. 1 to 5 for the same etching time calculated based on the difference between the target deposited film thickness in the film deposition process and the target film, thickness in the etching process. At this time, it is presumed that the etching amounts, that is, the etching depths of the films on semiconductor wafers Nos. 1 to 5 are roughly the same. In this case, as shown in FIG. 10(b), the post-etching film thickness t1 of semiconductor wafer No. 1 is most largely deviated from the average of the post-etching thicknesses t1, t2, t3, t4, and t5 of semiconductor wafers Nos. 1 to 5. Therefore, by measuring the post-etching film thickness of semiconductor wafer No. 1, having the least wafer number, as a measuring wafer, the average post-etching film thickness of semiconductor wafers Nos. 1 to 5 will not be obtained.

(Second Problem of Conventional Method for Determining Measuring Wafer)

Another problem arises when the processing results of a given process on inner-lot wafers are measured using a measuring wafer and the measuring wafer used must be discarded. The measuring wafer may be a semiconductor wafer having processing results close to the target value of the processing results of a process performed for the inner-lot wafers prior to the given process, that is, a semiconductor wafer having good processing results. This results in discarding the semiconductor wafer having good processing results.

The above second problem of the conventional measuring wafer determining method will be described with reference to FIGS. 11(a) and 11(b), taking as an example the case of measuring steps on the surfaces of five semiconductor wafers Nos. 1 to 5 constituting one lot after multi-layer wiring structures have been formed thereon. The measurement of steps on the semiconductor wafer surface (step measurement) includes determining whether or not steps within specifications have been formed for the film and the like on the semiconductor wafer by etching or the like. This is performed by physically tracing the surface of the semiconductor wafer with a fine needle or the like, for example. The semiconductor wafer used for this step measurement therefore must be discarded without being used for subsequent processes.

FIG. 11(a) illustrates the results of a process of forming lower lines on semiconductor wafers Nos. 1 to 5 (lower line formation process). Referring to FIG. 11(a), a lower line 2 made of an aluminum film, for example, is formed on each of semiconductor wafers Nos. 1 to 5 as a substrate 1. The electric characteristic data, for example, the electric resistances of the lower lines 2 of semiconductor wafers Nos. 1 to 5 (lower line resistances), denoted by r1, r2, r3, r4, and r5, respectively, are measured after the lower line formation process. Assume that the lower line resistance r1 of semiconductor wafer No. 1 is closest to the target value of the lower line resistance. That is, the electric characteristic data of the lower line 2 of semiconductor wafer No. 1 is better than those of the lower lines 2 of semiconductor wafers Nos. 2 to 5.

FIG. 11(b) illustrates the results of a process of forming upper lines on semiconductor wafers Nos. 1 to 5 (upper line formation process). Referring to FIG. 11(b), an interlayer insulating film 3 is formed over each of semiconductor wafers Nos. 1 to 5 as the substrate 1 including the lower line 2 formed thereon, and an upper line 4 made of an aluminum film, for example, is formed on the interlayer insulating film 3. The upper line 4 is formed by etching an aluminum film or the like deposited on the interlayer insulating film 3.

If semiconductor wafer No. 1, having the least wafer number, is used as a measuring wafer for the step measurement, semiconductor wafer No. 1 including the lower line 2 having the best electric characteristic data will be discarded after the step measurement.

(Other Problem)

Conventionally, in order to avoid excessive production of semiconductor devices as products, the number of lots newly fed (lots introduced into a fabrication apparatus used for an initial process) is adjusted, or the number of semiconductor wafers in a lot newly fed is adjusted, based on the yield of a lot that has completed all the processes.

The conventional method for adjusting the number of wafers has the following problem. The yield may be under enhancement while a lot is under processing. Since all wafers in a lot already fed follow a predetermined process procedure, yield enhancement may results in excessive production of semiconductor devices as products. If the inner-lot wafers are subjected to a process using a single wafer processing equipment, the turn around time (TAT) increases unnecessarily.

SUMMARY OF THE INVENTION

The first object of the present invention is determining a preceding wafer so that by using the preceding wafer the processing results of a process are within specifications for a majority of inner-lot wafers.

The second object of the present invention is determining a measuring wafer so that by using the measuring wafer the average processing results are obtained for a process, or determining a measuring wafer so that a semiconductor wafer having good processing results will not be discarded.

The third object of the present invention is preventing excessive production of semiconductor devices as products and reducing TAT.

In order to attain the first object, the method for determining a preceding wafer of the present invention includes the steps of: determining a preceding wafer comprising at least one semiconductor wafer among a plurality of semiconductor wafers constituting one lot; performing a given process among a plurality of processes for fabrication of a semiconductor device for the preceding wafer; and performing the given process for the plurality of semiconductor wafers other than the preceding wafer after examination of processing results of the given process on the preceding wafer, wherein the step of determining a preceding wafer includes determining the preceding wafer based on processing results of an upstream process among the plurality of processes performed for the plurality of semiconductor wafers prior to the given process.

According to the method for determining a preceding wafer of the present invention, the preceding wafer is determined among a plurality of semiconductor wafers constituting one lot (inner-lot wafers) based on processing results of an upstream process performed for the inner-lot wafers prior to a given process. The preceding wafer is then subjected to the given process to examine the processing results. Thereafter, the given process is performed for the remaining inner-lot wafers other than the preceding wafer. This allows the preceding processing for the given process to be performed in consideration of a variation in the processing results of the upstream process on the inner-lot wafers. Thus, when the processing results of the upstream process are influential on the processing results of the given process, it is possible to suppress a variation in the processing results of the given process on the inner-lot wafers, so that the processing results of the given process can be within specifications for a majority of the inner-lot wafers.

Preferably, the step of determining a preceding wafer includes determining as the preceding wafer a semiconductor wafer among the plurality of semiconductor wafers that has processing results close to an average of the processing results of the upstream process on the plurality of semiconductor wafers.

With the preceding wafer determined in the above manner, the processing conditions of the given process may be adjusted so that the processing results of the given process on the preceding wafer are equal to the target value thereof. By this adjustment, the processing results of the given process on the inner-lot wafers other than the preceding wafer can be made close to the target value with certainty. This reliably reduces the number of semiconductor wafers in one lot that are discarded due to nonconforming processing results.

In order to attain the second object, the method for determining a measuring wafer of the present invention includes the steps of: determining a measuring wafer comprising at least one semiconductor wafer among a plurality of semiconductor wafers constituting one lot; performing a given process among a plurality of processes for fabrication of a semiconductor device for the plurality of semiconductor wafers; and measuring processing results of the given process on the measuring wafer, wherein the step of determining a measuring wafer includes determining the measuring wafer based on processing results of an upstream process among the plurality of processes performed for the plurality of semiconductor wafers prior to the given process.

According to the method for determining a measuring wafer of the present invention, the measuring wafer is determined among inner-lot wafers based on the processing results of an upstream process performed for the inner-lot wafers prior to a given process. The given process is then performed for the inner-lot wafers, and the processing results of the given process on the measuring wafer are measured. This makes it possible to measure the processing results of the given process using the measuring wafer in consideration of a variation in the processing results of the upstream process on the inner-lot wafers. Thus, when the processing results of the upstream process are influential on the processing results of the given process, it is possible to obtain average processing results of the given process on the inner-lot wafers. Also, if the measuring wafer is to be discarded after the measurement of the processing results of the given process, an occurrence of discarding a semiconductor wafer that has exhibited good processing results for the upstream process is avoided.

Preferably, the step of determining a measuring wafer includes determining as the measuring wafer a semiconductor wafer among the plurality of semiconductor wafers that has processing results close to an average of the processing results of the upstream process on the plurality of semiconductor wafers.

With the measuring wafer determined in the above manner, when the processing results of the upstream process are influential on the processing results of the given process, it is possible to obtain the average processing results of the given process on the inner-lot wafers.

Preferably, the step of determining a measuring wafer includes determining as the measuring wafer a semiconductor wafer among the plurality of semiconductor wafers that has processing results largely deviated from a target value of the processing results of the upstream process.

With the measuring wafer determined in the above manner, when the measuring wafer is to be discarded after the measurement of the processing results of the given process, it is possible to avoid an occurrence of discarding a semiconductor wafer that has exhibited processing results close to the target value of the processing results of the upstream process, that is, good processing results for the upstream process.

In order to attain the third object, the method for adjusting the number of wafers of the present invention includes the steps of: determining an excluding wafer comprising at least one semiconductor wafer to be excluded from a given lot composed of a plurality of semiconductor wafers; and after excluding the excluding wafer from the given lot, performing a given process among a plurality of processes for fabrication of a semiconductor device for the remaining semiconductor wafers in the given lot, wherein the step of determining an excluding wafer includes determining the excluding wafer based on a yield of a lot that has completed the plurality of processes and processing results of an upstream process among the plurality of processes performed for the plurality of semiconductor wafers prior to the given process.

According to the method for adjusting the number of wafers of the present invention, the excluding wafers to be excluded from a given lot are determined based on the yield of a lot that has completed all processes and the processing results of an upstream process performed for semiconductor wafers constituting the given lot (inner-lot wafers) prior to a given process. The excluding wafers are then excluded from the given lot, and the remaining semiconductor wafers are subjected to the given process. Therefore, when the yield is under enhancement due to process improvement during processing of the given lot, it is possible to reduce the number of wafers in the given lot before start of the given process for the given lot depending on the yield at that time and the processing results of the upstream process. This prevents excessive production of semiconductor devices as products, and also reduces TAT by the number of excluding wafers excluded from the given lot if a process using a single wafer processing equipment is to be performed for the wafers in the given lot at a subsequent stage.

Preferably, the step of determining an excluding wafer includes calculating the number of excluding wafers based on the yield and determining as the excluding wafer a semiconductor wafer of the quantity equal to the calculated number of excluding wafers that has processing results largely deviated from a target value of the processing results of the upstream process.

By determining the excluding wafer in the above manner, it is possible to reduce the number of wafers in the given lot while preventing an occurrence of excluding a semiconductor wafer that has exhibited processing results close to the target value of the processing results of the upstream process, that is, good processing results for the upstream process.

BRIEF DESCRIPTION OF THE DRAWINGS

FIG. 1 is a flowchart of a method for determining a preceding wafer of EMBODIMENT 1 of the present invention.

DESCRIPTION OF THE PREFERRED EMBODIMENTS

Hereinafter, preferred embodiments of the present invention will be described with reference to the accompanying drawings.

Embodiment 1

The method for determining a preceding wafer of EMBODIMENT 1 of the present invention will be described with reference to the relevant drawings, taking as an example the case of performing preceding processing for a process of etching a film deposited on each of five semiconductor wafers Nos. 1 to 5 constituting one lot (etching process).

In this embodiment, assume that each lot is subjected to a plurality of processes (including a measuring process for obtaining the processing results of a process) for fabrication of semiconductor devices. Assume also that the etching process for which preceding processing is performed is the n-th (n>1) process.

FIG. 1 is a flowchart of the method of this embodiment. First, at step S11, the first to i-th ($1 \leq i \leq n-1$) processes are performed for semiconductor wafers Nos. 1 to 5. One of the first to i-th processes is a film deposition process where a film is deposited on each of semiconductor wafers Nos. 1 to 5.

At step S12, as the j-th ($i \leq j \leq n-1$) process, performed is a process of measuring the processing results of the film deposition process performed for semiconductor wafers Nos. 1 to 5 (processing result measuring process), that is, a process of measuring the thickness of the film deposited on each of semiconductor wafers Nos. 1 to 5 (deposited film thickness).

Figure 2A:
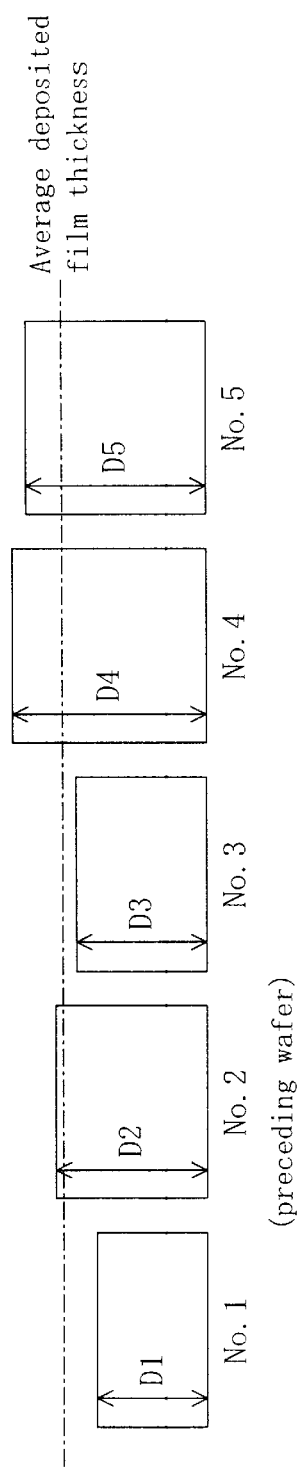
FIG. 2(a) illustrates the processing results of a film deposition process used for determining a preceding wafer in the method of EMBODIMENT 1.

FIG. 2(a) illustrates the processing results of the film deposition process on semiconductor wafers Nos. 1 to 5. In FIG. 2(a), the respective semiconductor wafers as substrates are omitted for simplification.

As shown in FIG. 2(a), among the deposited film thicknesses of semiconductor wafers Nos. 1 to 5, denoted by D1, D2, D3, D4, and D5, respectively, the deposited film thickness D2 of semiconductor wafer No. 2 is closest to the average of the deposited film thicknesses D1 to D5 of semiconductor wafers Nos. 1 to 5 (average deposited film thickness).

At step S13, the (j+1)th to (n−1)th processes are performed for semiconductor wafers Nos. 1 to 5.

At step S14 (preceding wafer selection process), semiconductor wafer No. 2 having the deposited film thickness closest to the average of the processing results of the film deposition process (average deposited film thickness) measured in the processing result measuring process is determined as a preceding wafer in the n-th process among semiconductor wafers Nos. 1 to 5.

At step S15, the n-th process, that is, an etching process is performed for semiconductor wafer No. 2 determined as a preceding wafer at step S14. More specifically, the etching process is performed for semiconductor wafer No. 2 so that the film thickness remaining after the etching (post-etching film thickness) is equal to the target film thickness, to determine the etching time required for this etching process.

At step S16, the etching process is performed for remaining semiconductor wafers Nos. 1 and 3 to 5 for the etching time determined at step S15. At this time, it is presumed that the etching amounts, that is, the etching depths of the deposited films on semiconductor wafers Nos. 1 to 5 are roughly the same.

Figure 2B:
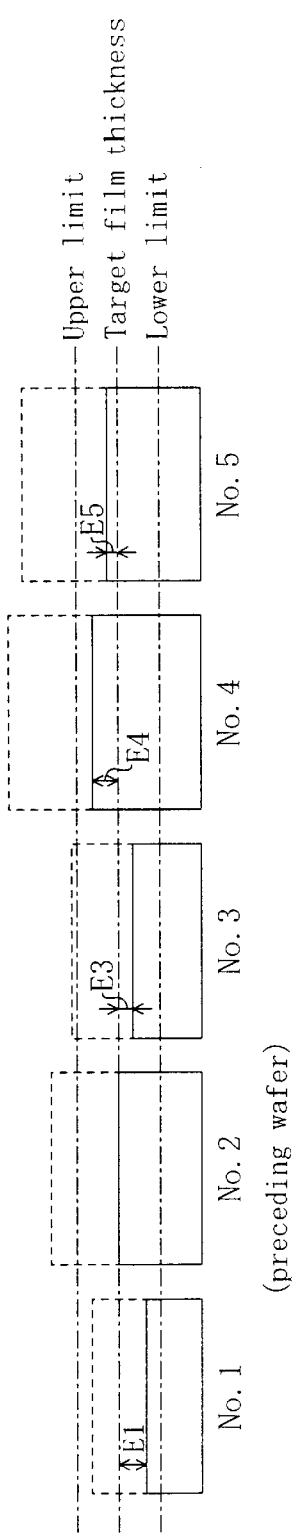
FIG. 2(b) illustrates the processing results of an etching process for which preceding processing has been performed using the preceding wafer determined according to the method of EMBODIMENT 1.

FIG. 2(b) illustrates the processing results of the etching process on semiconductor wafers Nos. 1 to 5. In FIG. 2(b), also, the respective semiconductor wafers as substrates are omitted for simplification.

As is apparent from FIG. 2(b), the amounts of deviation of the post-etching film thicknesses of semiconductor wafers Nos. 1 and 3 to 5 from the target film thickness, denoted by E1, E3, E4, and E5, respectively, are small, with these post-etching film thicknesses being within specifications (between the lower limit and the upper limit). The respective areas defined by the dotted lines represent the portions of the films deposited in the film deposition process shown in FIG. 2(a) but removed in the etching process.

Thus, in this embodiment, a preceding wafer is determined among the inner-lot wafers based on the results of the film deposition process performed for the inner-lot wafers before the etching process. The preceding wafer determined is then subjected to the etching process. The etching time is adjusted based on the results of the etching process on the preceding wafer. Thereafter, the inner-lot wafers other than the preceding wafer are subjected to the etching process. This allows the preceding processing for the etching process to be performed in consideration of a variation in the results of the film deposition process on the inner-lot wafers (i.e., a variation in deposited film thickness). As a result, it is possible to suppress a variation in the results of the etching process on the inner-lot wafers (i.e., a variation in post-etching film thickness), allowing the post-etching film thicknesses of a majority of the inner-lot wafers to be within specifications.

The semiconductor wafer having the deposited film thickness closest to the average deposited film thickness is determined as a preceding wafer among the inner-lot wafers. Therefore, by adjusting the etching time so that the post-etching film thickness of the preceding wafer is equal to the target film thickness, the post-etching film thicknesses of the inner-lot wafers other than the preceding wafer can be made close to the target film thickness with certainty. This reduces the number of semiconductor wafers in one lot discarded due to nonconforming post-etching film thickness.

In this embodiment, the number of semiconductor wafers constituting one lot is not specifically limited. Also, in this embodiment, the timing at which the preceding wafer selection process is performed is not specifically limited as long as it is between the processing result measuring process and the etching process.

In this embodiment, the preceding wafer used for the etching process for which preceding processing is performed is determined based on the processing results of the film deposition process performed prior to the etching process (i.e., the deposited film thickness). It should however be understood that the preceding wafer for a given process for which preceding processing is performed may be determined based on the processing results of an arbitrary process performed prior to the given process.

In this embodiment, the processing results of the film deposition process (i.e., the deposited film thickness) were measured for all the semiconductor wafers constituting one lot, and one semiconductor wafer having the deposited film thickness closest to the average of the measured deposited film thicknesses was determined as the preceding wafer. Alternatively, the deposited film thickness may be measured for part (at least two) of the semiconductor wafers constituting one lot, to determine one semiconductor wafer having the deposited film thickness closest to the average of the measured deposited film thicknesses as the preceding wafer. It is also possible to measure the deposited film thickness for all or part of the semiconductor wafers constituting one lot, to determine a plurality of semiconductor wafers having a deposited film thickness close to the average of the measured deposited film thicknesses as the preceding wafers.

Embodiment 2

The method for determining a measuring wafer of EMBODIMENT 2 of the present invention will be described with reference to the relevant drawings, taking as an example the case of measuring the film thickness remaining after etching (post-etching film thickness) of a film deposited on each of five semiconductor wafers Nos. 1 to 5 constituting one lot.

In this embodiment, assume that each lot is subjected to a plurality of processes (including a measuring process for obtaining the processing results of a process) for fabrication of semiconductor devices. Assume also that the process of measuring the post-etching film thickness (post-etching film thickness measuring process) is the n-th (n>1) process.

Figure 3:
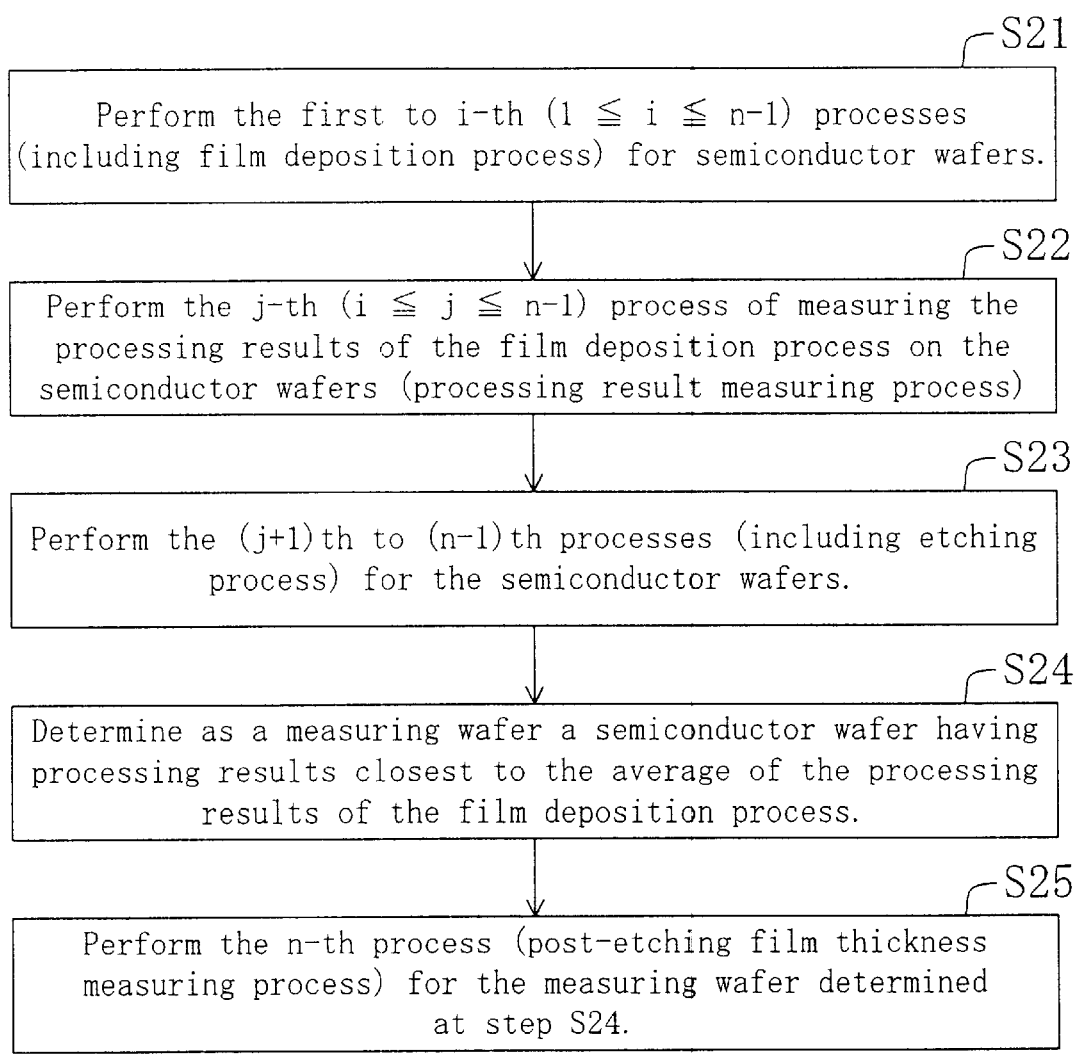
FIG. 3 is a flowchart of a method for determining a measuring wafer of EMBODIMENT 2 of the present invention.

FIG. 3 is a flowchart of the method of this embodiment. First, at step S21, the first to i-th ($1 \leq i \leq n-1$) processes are performed for semiconductor wafers Nos. 1 to 5. One of the first to i-th processes is a film deposition process where a film is deposited on each of semiconductor wafers Nos. 1 to 5.

At step S22, as the j-th ($i \leq j \leq n-1$) process, performed is a process of measuring the processing results of the film deposition process performed for semiconductor wafers Nos. 1 to 5 (processing result measuring process), that is, a process of measuring the deposited film thickness of each of semiconductor wafers Nos. 1 to 5.

Figure 4A:
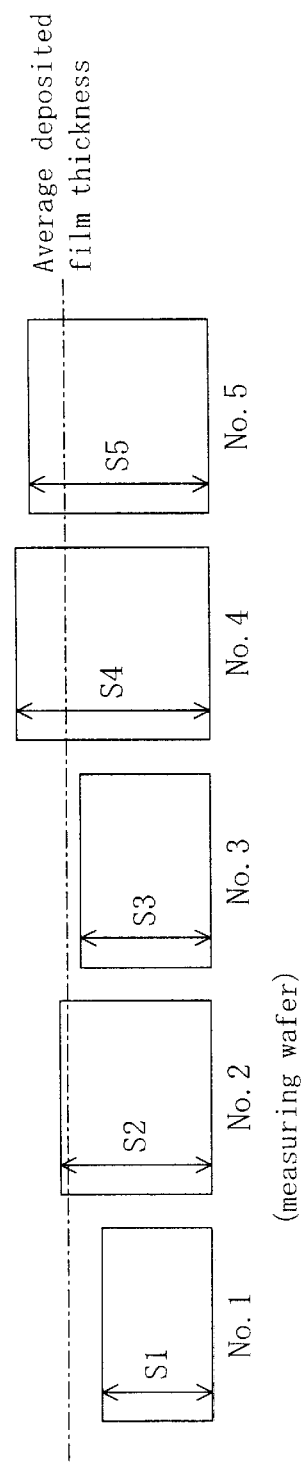
FIG. 4(a) illustrates the processing results of a film deposition process used for determining a measuring wafer in the method of EMBODIMENT 2.

FIG. 4(a) illustrates the processing results of the film deposition process on semiconductor wafers Nos. 1 to 5. In FIG. 4(a), the respective semiconductor wafers as substrates are omitted for simplification.

As shown in FIG. 4(a), among the deposited film thicknesses of semiconductor wafers Nos. 1 to 5, denoted by S1, S2, S3, S4, and S5, respectively, the deposited film thickness S2 of semiconductor wafer No. 2 is closest to the average of the deposited film thicknesses S1 to S5 of semiconductor wafers Nos. 1 to 5 (average deposited film thickness).

At step S23, the (j+1)th to (n−1)th processes are performed for semiconductor wafers Nos. 1 to 5. One of the (j+1)th to (n−1)th processes is an etching process where the film deposited on each of semiconductor wafer Nos. 1 to 5 is etched.

Figure 4B:
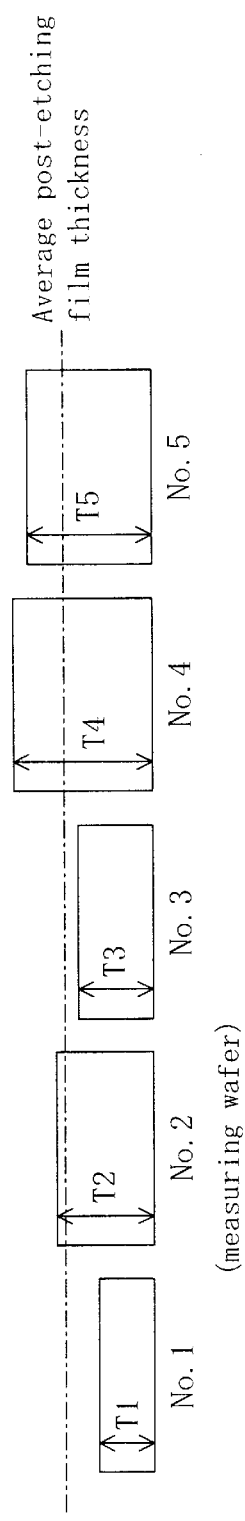
FIG. 4(b) illustrates the processing results of an etching process for which film thickness measurement is to be performed using a measuring wafer determined according to the method of EMBODIMENT 2.

FIG. 4(b) illustrates the processing results of the etching process on semiconductor wafers Nos. 1 to 5. In FIG. 4(b), also, the respective semiconductor wafer as substrates are omitted for simplification.

If the etching process is performed for semiconductor wafers Nos. 1 to 5 for the same etching time calculated based on the difference between the target deposited film thickness in the film deposition process and the target film thickness in the etching process, it is presumed that the etching amounts, that is, the etching depths of the deposited films on semiconductor wafers Nos. 1 to 5 are roughly the same. As shown in FIG. 4(b), among the post-etching film thicknesses of semiconductor wafers Nos. 1 to 5, denoted by T1, T2, T3, T4, and T5, respectively, the post-etching film thickness T2 of semiconductor wafer No. 2 is closest to the average of the post-etching thicknesses T1 to T5 of semiconductor wafers Nos. 1 to 5, that is, the average post-etching film thickness.

At step S24 (measuring wafer selection step), semiconductor wafer No. 2 having the deposited film thickness closest to the average of the processing results of the film deposition process (i.e., the average deposited film thickness) measured at the processing result measuring process is determined as a measuring wafer among semiconductor wafers Nos. 1 to 5 in the n-th process.

At step S25, as the n-th process, a post-etching film thickness measuring process is performed for semiconductor wafer No. 2 determined as the measuring wafer at step S24. In this way, the post-etching film thickness T2 of semiconductor wafer No. 2 closest to the average post-etching film thickness is obtained as the measured value.

Thus, in this embodiment, a measuring wafer is determined among the inner-lot wafers based on the processing results of the film deposition process performed for the inner-lot wafers prior to the etching process. The etching process is then performed for the inner-lot wafers. Thereafter, the measuring wafer is subjected to the post-etching film thickness measuring process. This permits use of the semiconductor wafer having a deposited film thickness closest to the average deposited film thickness among the inner-lot wafers as a measuring wafer, to measure the processing results of the etching process (i.e., the post-etching film thickness). As a result, it is possible to obtain the average post-etching film thickness of the inner-lot wafers as the measured value.

In this embodiment, the number of semiconductor wafers constituting one lot is not specifically limited. Also, in this embodiment, the timing at which the measuring wafer selection process is performed is not specifically limited as long as it is between the processing result measuring process and the post-etching film thickness measuring process.

In this embodiment, the measuring wafer used in the post-etching film thickness measuring process for measuring the processing results of the etching process was determined based on the processing results of the film deposition process performed prior to the etching process. It should however be understood that the measuring wafer used in a given measuring process for measuring the processing results of a given process may be determined based on processing results of an arbitrary process performed prior to the given process.

In this embodiment, the processing results of the film deposition process (i.e., the deposited film thickness) were measured for all the semiconductor wafers constituting one lot, and one semiconductor wafer having the deposited film thickness closest to the average of the measured deposited film thicknesses was determined as the measuring wafer. Alternatively, the deposited film thickness may be measured for part (at least two) of the semiconductor wafers constituting one lot, to determine one semiconductor wafer having the deposited film thickness closest to the average of the measured deposited film thicknesses as the measuring wafer. It is also possible to measure the deposited film thickness for all or part of the semiconductor wafers constituting one lot, to determine a plurality of semiconductor wafers having a deposited film thickness close to the average of the measured deposited film thicknesses as the measuring wafers.

Embodiment 3

The method for determining a measuring wafer of EMBODIMENT 3 of the present invention will be described with reference to the relevant drawings, taking as an example the case of measuring steps on a surface of each of five semiconductor wafers Nos. 1 to 5 constituting one lot after formation of a multi-layer wiring structure thereon.

In this embodiment, assume that each lot is subjected to a plurality of processes (including a measuring process for obtaining the processing results of a process) for fabrication of semiconductor devices. Assume also that the process of measuring steps on the semiconductor wafer surfaces (step measuring process) is the n-th (n>1) process. This embodiment is applied to the method for determining a measuring wafer in which the measuring wafer must be discarded after use or measurement, such as the step measuring process.

Figure 5:
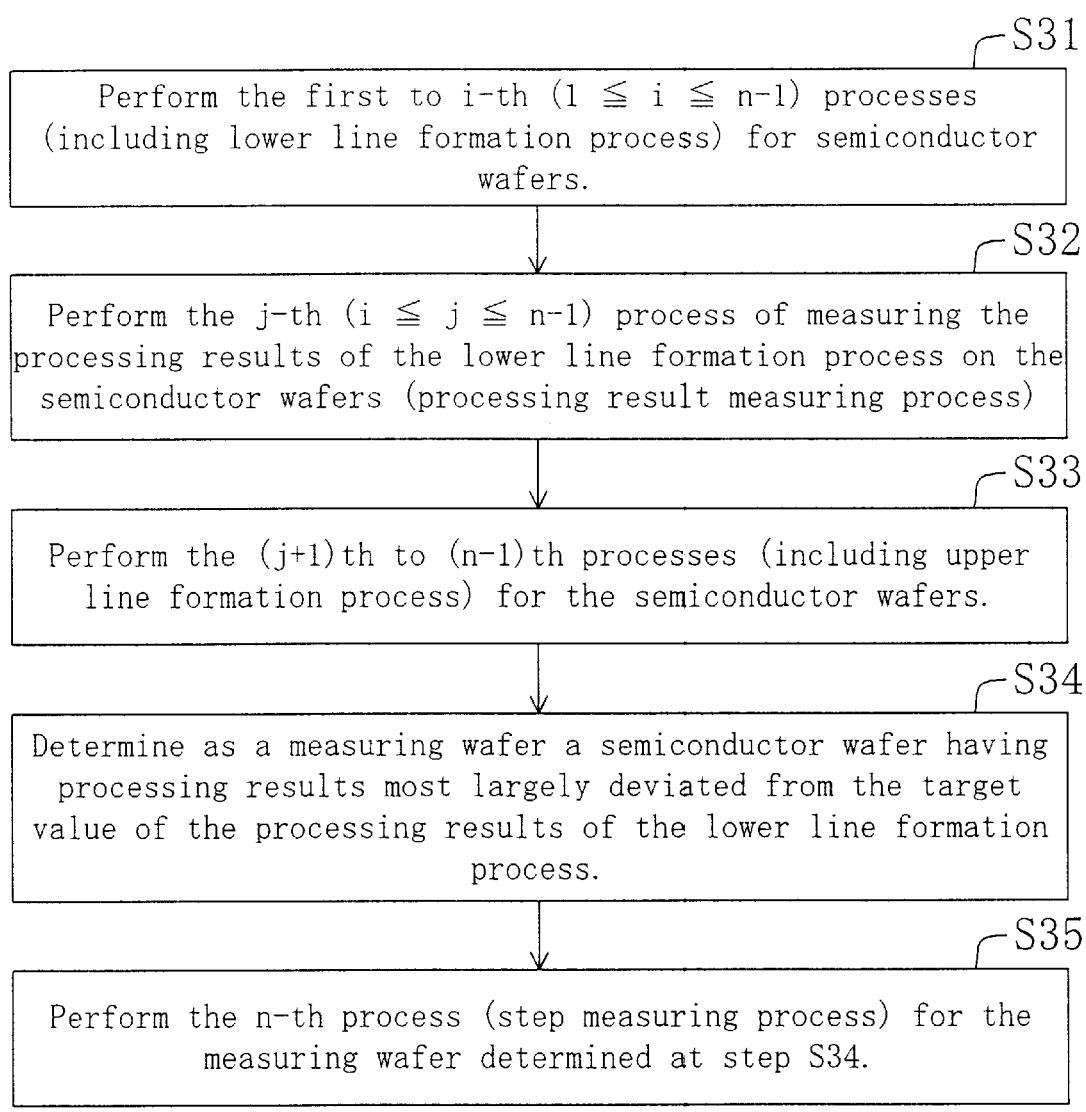
FIG. 5 is a flowchart of a method for determining a measuring wafer of EMBODIMENT 3 of the present invention.

FIG. 5 is a flowchart of the method of this embodiment. First, at step S31, the first to i-th ($1 \leq i \leq n-1$) processes are performed for semiconductor wafers Nos. 1 to 5. One of the first to i-th processes is a lower line formation process where lower lines are formed on each of semiconductor wafers Nos. 1 to 5.

At step S32, as the j-th ($i \leq j \leq n-1$) process, performed is a process of measuring the processing results of the lower line formation process on semiconductor wafers Nos. 1 to 5 (processing result measuring process), that is, a process of measuring the electric characteristic data such as the electric resistance of the lower lines formed on each of semiconductor wafers Nos. 1 to 5 (lower line resistance).

Figure 6A:
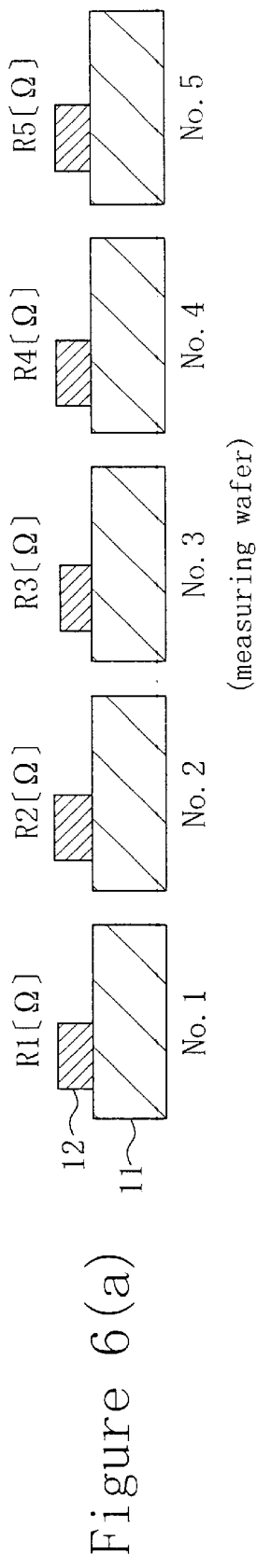
FIG. 6(a) illustrates the processing results of a lower line formation process used for determining a measuring wafer in the method of EMBODIMENT 3.
Figure 6B:
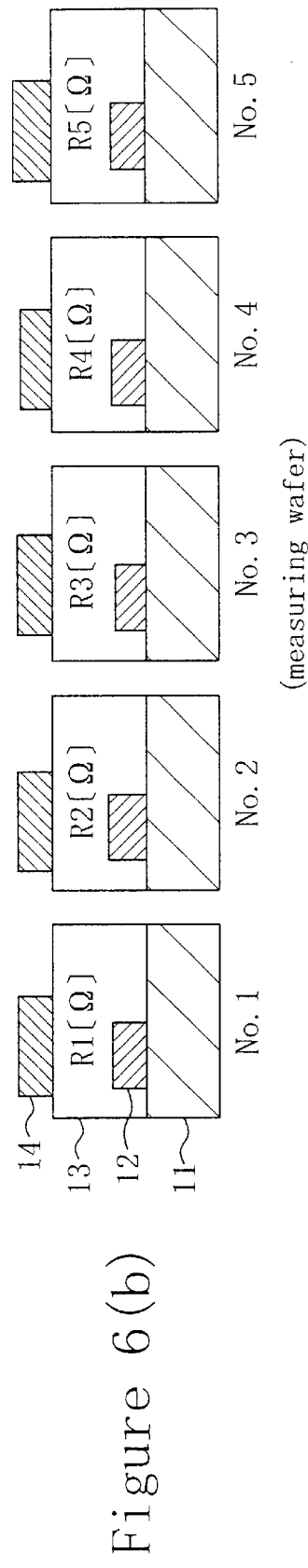
FIG. 6(b) illustrates the processing results of an upper line formation process for which step measurement is to be performed using a measuring wafer determined according to the method of EMBODIMENT 3.

FIG. 6(*a*) illustrates the processing results of the lower line formation process on semiconductor wafers Nos. 1 to 5. As shown in FIG. 6(*a*), a lower line 12 made of an aluminum film, for example, is formed on each of semiconductor wafers Nos. 1 to 5 as a substrate 11. The lower line resistances of semiconductor wafers Nos. 1 to 5, denoted by R1, R2, R3, R4, and R5, respectively, are measured and found that the lower line resistance R3 of semiconductor wafer No. 3 is most largely deviated from the target value of the lower line resistance (target resistance value), indicating that the electric characteristic data of the lower line 12 of semiconductor wafer No. 3 is poorer than those of the lower lines 12 of semiconductor wafers Nos. 1, 2, 4, and 5.

At step S33, the (j+1)th to (n−1)th processes are performed for semiconductor wafers Nos. 1 to 5. One of the (j+1)th to (n−1)th processes is an upper line formation process where upper lines are formed on each of semiconductor wafers Nos. 1 to 5.

FIG. 6(*b*) illustrates the processing results of the upper line formation process on semiconductor wafers Nos. 1 to 5. As shown in FIG. 6(*b*), an interlayer insulating film 13 is formed over each of semiconductor wafers Nos. 1 to 5 as the substrate 11 including the lower line 12 formed thereon, and an upper line 14 made of an aluminum film, for example, is formed on the interlayer insulating film 13. The upper line 14 is formed by etching an aluminum film or the like deposited on the interlayer insulating film 13.

At step S34 (measuring wafer selection step), semiconductor wafer No. 3 having the lower line resistance most largely deviated from the target resistance value among semiconductor wafers Nos. 1 to 5 is determined as a measuring wafer in the n-th process based on the processing results of the lower line formation process (i.e., the lower line resistance) measured in the processing result measuring process.

At step S35, as the n-th process, a step measuring process is performed for semiconductor wafer No. 3 determined as the measuring wafer at step S34. In this way, semiconductor wafer No. 3 of which lower line resistance is most largely deviated from the target value is discarded after the step measuring process. It should be noted that the quality of the lower line resistance as the electric characteristic data measured in the processing result measuring process is irrelevant to the quality of the steps on the semiconductor wafer surface measured in the step measuring process.

Thus, in this embodiment, a measuring wafer is determined among the inner-lot wafers based on the processing results of the lower line formation process performed for the inner-lot wafers prior to the upper line formation process. The upper line formation process is then performed for the inner-lot wafers. Thereafter, the measuring wafer is subjected to the step measuring process. This permits use of the semiconductor wafer having a lower line resistance most largely deviated from the target resistance value among the inner-lot wafers as the measuring wafer, to perform the step measuring process. As a result, it is possible to prevent an occurrence of discarding a semiconductor wafer having a lower line resistance close to the target resistance value, that is, a semiconductor wafer having good electric characteristic data.

In this embodiment, the number of semiconductor wafers constituting one lot is not specifically limited. Also, in this embodiment, the timing at which the measuring wafer selection process is performed is not, specifically limited as long as it is between the processing result measuring process and the step measuring process.

In this embodiment, the measuring wafer used in the step measuring process for measuring the processing results of the upper line formation process was determined based on the processing results of the lower line formation process performed prior to the upper line formation process. It should however be understood that the measuring wafer used in a given measuring process for measuring the processing results of a given process may be determined based on the processing results of an arbitrary process performed prior to the given process.

In this embodiment, the processing results of the lower line formation process (i.e., the lower line resistance) were measured for all the semiconductor wafers constituting one lot, and one semiconductor wafer having the lower line resistance most largely deviated from the target resistance value was determined as the measuring wafer. Alternatively, the lower line resistance may be measured for part (at least two) of the semiconductor wafers constituting one lot, to determine one semiconductor wafer having the lower line resistance most largely deviated from the target resistance value as the measuring wafer. It is also possible to measure the lower line resistance of all or part of the semiconductor wafers constituting one lot, to determine a plurality of semiconductor wafers having a lower line resistance deviated largely from the target resistance value as the measuring wafers.

Embodiment 4

The method for adjusting the number of wafers of EMBODIMENT 4 of the present invention will be described with reference to the relevant drawings.

In this embodiment, assume that a plurality of lots are sequentially subjected to a plurality of processes (including a measuring process for obtaining the processing results of a process) for fabrication of semiconductor devices. Each lot includes a plurality of semiconductor wafers, and from each of the semiconductor wafers, a plurality of semiconductor devices (semiconductor chips) are produced as products. This embodiment is applied to the method for adjusting the number of wafers in the case where the yield is under enhancement due to process improvement during processing of a lot.

Figure 7:
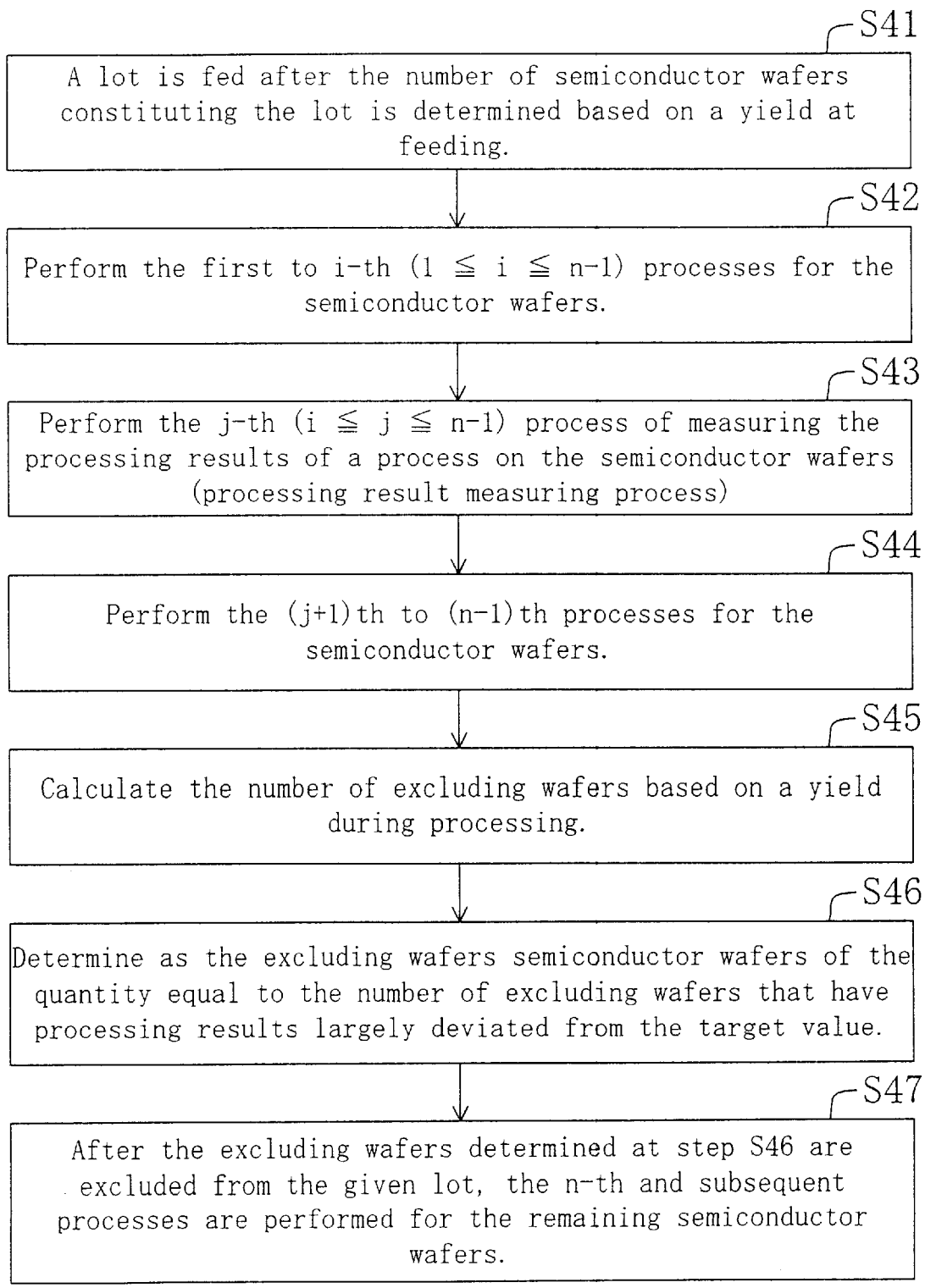
FIG. 7 is a flowchart of a method for adjusting the number of wafers of EMBODIMENT 4 of the present invention.

FIG. 7 is a flowchart of the method of this embodiment. First, at step S41, before a given lot is newly fed, the number of semiconductor wafers required for the given lot at the feeding (required number of wafers) is determined based on the yield of a lot that has completed all the processes at that time (yield at feeding) and the number of semiconductor chips demanded for each lot (demanded number of chips). Thereafter, the given lot including the required number of semiconductor wafers is fed.

For example, assuming that the number of semiconductor chips obtainable from one semiconductor wafer (number of obtainable chips) at a yield of 100% is 100, that the yield at feeding is 60%, and that the demanded number of chips is 3000, the required number of wafers X1 in the given lot at feeding is calculated as 50 from the following:

$$X1=3000 \div (100 \times 0.60).$$

At step S42, the first to i-th ($1 \leq i \leq n-1$) processes are performed for semiconductor wafers constituting the given lot (inner-lot wafers).

At step S43, as the j-th ($i \leq j \leq n-1$) process, performed is a process of measuring the processing results of either one of the first to i-th processes performed for the inner-lot wafers (processing result measuring process).

At step S44, the (j+1)th to (n−1)th processes are performed for the inner-lot wafers.

At step S45, before start of the n-th process for the inner-lot wafers, if the yield of a lot that has completed all the processes at that time (yield during processing) has enhanced from the yield at feeding, the number of semiconductor wafers to be excluded from the given lot (number of excluding wafers) is calculated.

The method for calculating the number of excluding wafers will be described with reference to FIG. 8.

Figure 8:
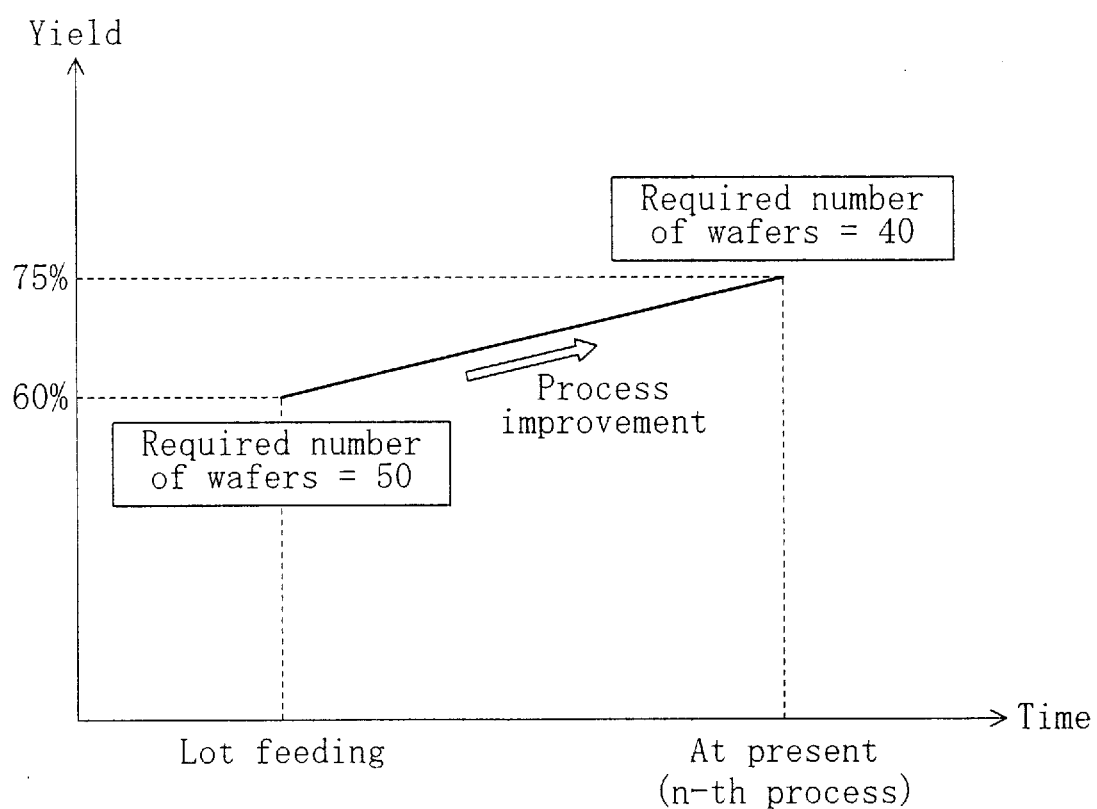
FIG. 8 is a view of an example of yield enhancement during processing of a lot.
Figure 9A:
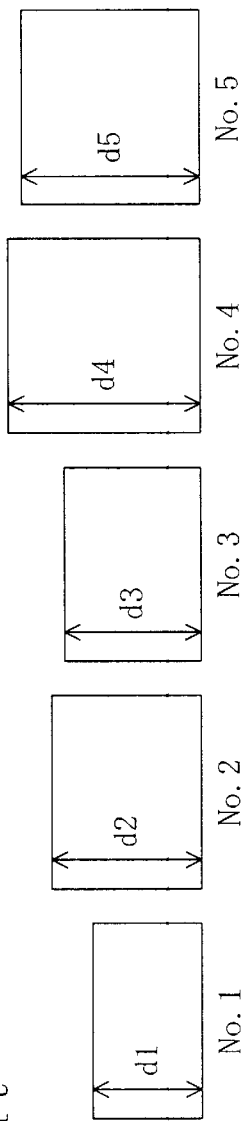
FIG. 9(a) illustrates the processing results of a film deposition process.
Figure 9B:
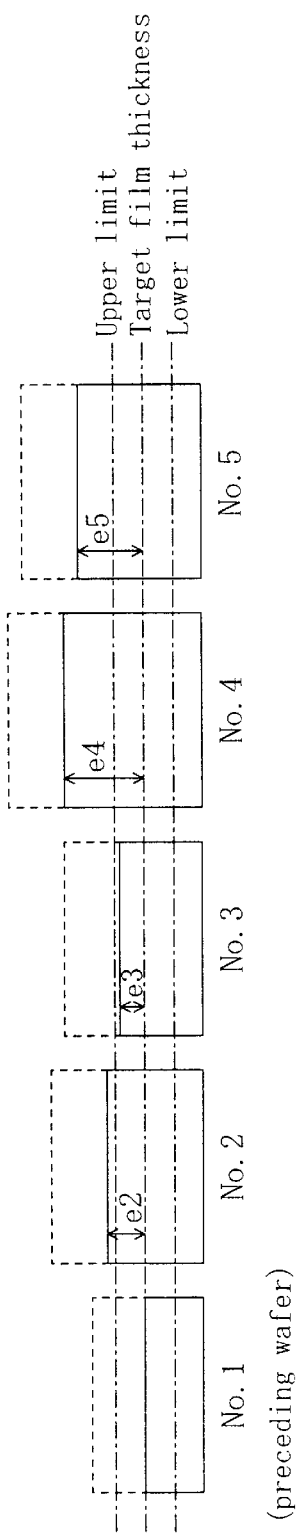
FIG. 9(b) illustrates the processing results of an etching process for which preceding processing has been performed using a preceding wafer determined according to a conventional method for determining a preceding wafer.
Figure 10A:
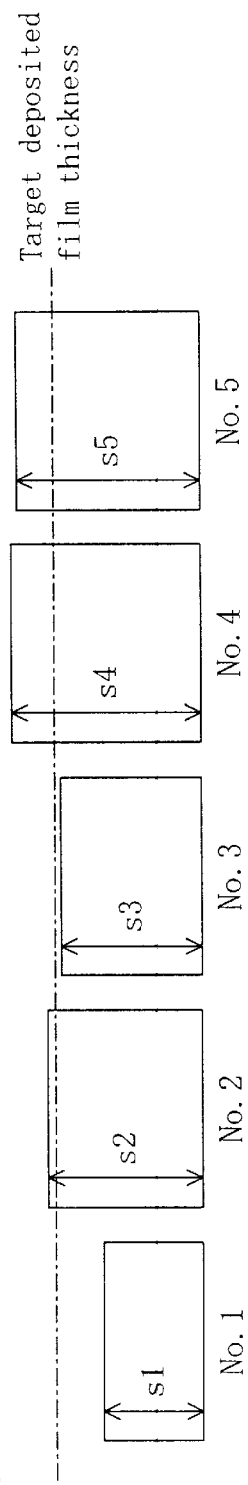
FIG. 10(a) illustrates the processing results of a film deposition process.
Figure 10B:
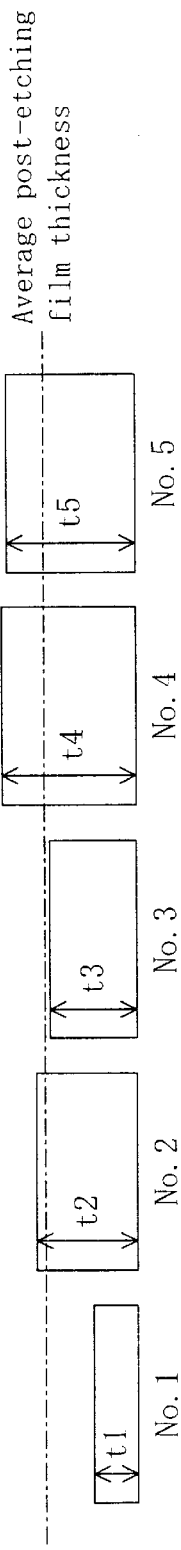
FIG. 10(b) illustrates the processing results of an etching process for which film thickness measurement is to be performed using a measuring wafer determined according to a conventional method for determining a measuring wafer.
Figure 11A:
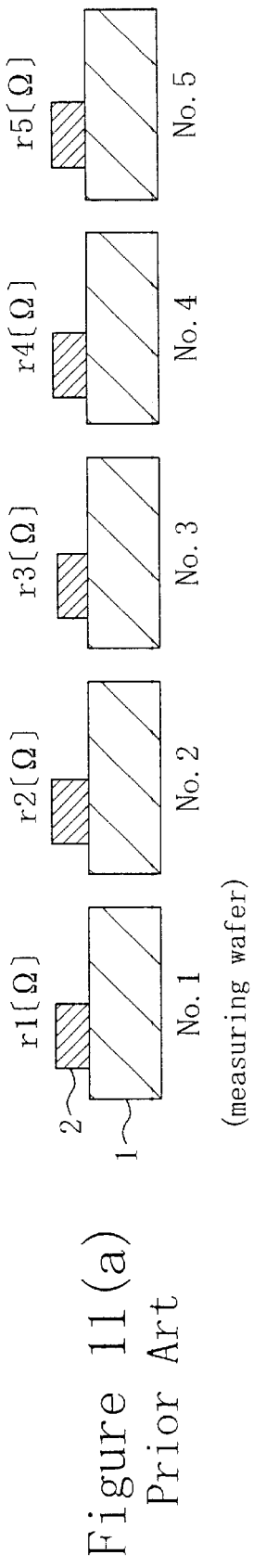
FIG. 11(a) illustrates the processing results of a lower line formation process.
Figure 11B:
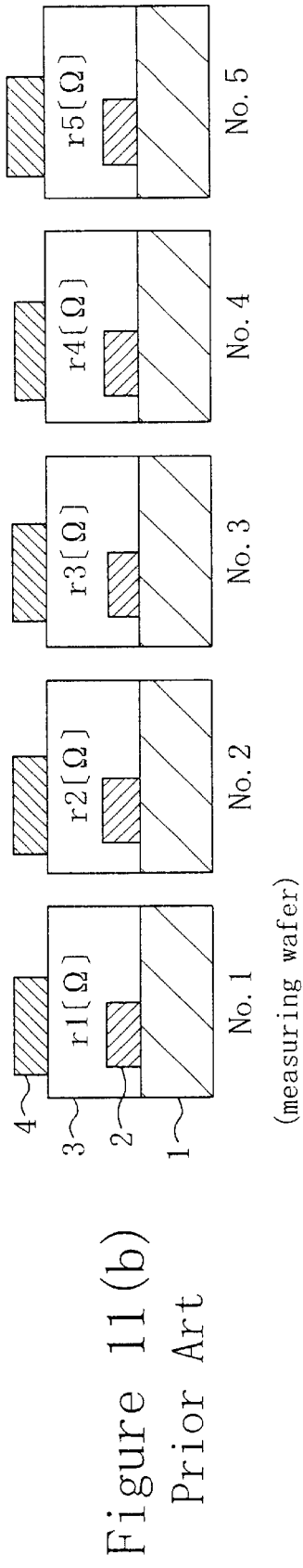
FIG. 11(b) illustrates the processing results of an upper line formation process for which step measurement is to be performed using a measuring wafer determined according to a conventional method for determining a measuring wafer.

FIG. 8 illustrates an example of yield enhancement during processing of a given lot.

Referring to FIG. 8, if the yield during processing at the time of start of the n-th process (at present) has enhanced to 75% from the yield at feeding of 60%, the required number of wafers X2 in the given-lot at present is calculated as 40 from the following:

$$X2=3000 \div (100 \times 0.75)$$

(assuming that the number of obtainable chips is 100 and the demanded number of chips is 3000 as at step S41).

Since the required number of wafers X1 in the given lot at feeding is 50, the number of excluding wafers F is 10 from F=50−40.

At step S46 (excluding wafer selection step), semiconductor wafers of the quantity equal to the number of excluding wafers (for example, 10 wafers) that have the processing results largely deviated from the, target value thereof are determined as excluding wafers among the inner-lot wafers based on the processing results measured in the processing result measuring process.

At step S47, the excluding wafers determined at step S46 are excluded from the given lot, and the n-th and subsequent processes are performed for the remaining semiconductor wafers in the given lot.

Thus, in this embodiment, excluding wafers to be excluded from a given lot are determined based on the yield of a lot that has completed all the processes and the processing results of a process (either one of the first to i-th processes) performed for the inner-lot wafers prior to a given process (n-th process). The excluding wafers are then excluded from the given lot, and the remaining semiconductor wafers are subjected to the given process. Therefore, when the yield is under enhancement due to process improvement during processing of the given lot, it is possible to reduce the number of wafers in the given lot before start of the given process for the given lot depending on the yield at that time and the processing results of an upstream process. This prevents excessive production of semiconductor chips as products. This also reduces TAT by the number of excluding wafers excluded from the given lot if a process using a single wafer processing equipment is to be performed for the wafers in the given lot at a subsequent stage.

Moreover, in this embodiment, after the number of excluding wafers is calculated based on the yield, semiconductor wafers of the quantity equal to the calculated number of excluding wafers that have processing results largely deviated from the target value thereof are determined as excluding wafers among the inner-lot wafers based on the processing results measured in the processing result measuring process. This permits reduction of the number of wafers in the given lot while preventing an occurrence of excluding semiconductor wafers having processing results close to the target value thereof, that is, semiconductor wafers having good processing results.

In this embodiment, the timing at which the excluding wafer selection process is performed is not specifically limited as long as it is between the processing result measuring process and the n-th process.

In this embodiment, the processing results were measured for all the semiconductor wafers constituting one lot, and a semiconductor wafer having processing results largely deviated from the target value was determined as an excluding wafer. Alternatively, the processing results may be measured for part (at least two) of the semiconductor wafers constituting one lot, to determine a semiconductor wafer having processing results largely deviated from the target value.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A method for determining a preceding wafer group, comprising the steps of:

determining a preceding wafer group comprising at least one semiconductor wafer among a plurality of semiconductor wafers constituting one lot;

performing a given process among a plurality of processes for fabrication of a semiconductor device for the preceding wafer group; and performing the given process for the plurality of semiconductor wafers other than the preceding wafer group after examination of processing results of the given process on the preceding wafer group, wherein the step of determining the preceding wafer group includes determining the preceding wafer group based on processing results of an upstream process among the plurality of processes performed for the plurality of semiconductor wafers constituting one lot prior to the given process.

2. The method of claim 1, wherein the step of determining the preceding wafer group includes determining as the preceding wafer group at least one semiconductor wafer among the plurality of semiconductor wafers that has processing results close to an average of the processing results of the upstream process on the plurality of semiconductor wafers.

* * * * *